United States Patent [19]
Weinrich et al.

[11] Patent Number: 6,037,256
[45] Date of Patent: Mar. 14, 2000

[54] METHOD FOR PRODUCING A NOBLE METAL-CONTAINING STRUCTURE ON A SUBSTRATE, AND SEMICONDUCTOR COMPONENT HAVING SUCH A NOBLE METAL-CONTAINING STRUCTURE

[75] Inventors: Volker Weinrich, München; Carlos Mazure-Espejo, Zorneding, both of Germany

[73] Assignee: Siemens Aktiengesellschaft, Munich, Germany

[21] Appl. No.: 09/015,452

[22] Filed: Jan. 29, 1998

[30]    Foreign Application Priority Data

Jan. 29, 1997 [DE] Germany ............................ 197 03 205

[51] Int. Cl.$^7$ .................................................. C23C 16/04
[52] U.S. Cl. .................... 438/679; 438/240; 438/250; 438/686; 148/281; 148/283; 427/252
[58] Field of Search ...................... 438/240, 250, 438/580, 660, 679, 686; 148/278, 281, 283; 427/252, 255.4

[56]    References Cited

U.S. PATENT DOCUMENTS

| 5,149,596 | 9/1992 | Smith et al. . | |
| 5,356,833 | 10/1994 | Maniar | 438/656 |
| 5,366,766 | 11/1994 | Sekiguchi | 427/255.4 |
| 5,494,704 | 2/1996 | Ackerman . | |

OTHER PUBLICATIONS

"Anisotropic Platinum and PZT Etch Process for Advanced Ferroelectric Device Applications", Alfred Cofer et al., Tegal European Plasma Seminar Proceedings, 1995, pp. 33–38.

"Anisotropic Platinum and PZT Etch Process for Advanced Ferroelectric Devices", Alfred Cofer, VMCI Conference, 1995, pp. 638–639.

"Platinum Etching and Plasma Characteristics in RF Magnetron and Electron Cyclotron Resonance Plasmas", Kazuyasu Nishikawa et al., Jpn. J. Appl. Phys., vol. 32, 1993, pp. 6102–6108.

*Primary Examiner*—Chandra Chaudhari
*Assistant Examiner*—Nema Berezny
*Attorney, Agent, or Firm*—Herbert L. Lerner; Laurence A. Greenberg

[57]    ABSTRACT

A method for producing a noble metal-containing structure on a substrate, and a semiconductor component having such a noble metal-containing structure, include introducing a noble metal into a preliminary structure by converting a gaseous compound of the noble metal with a non-noble metal in a preliminary structure into elementary noble metal and a gaseous compound of the non-noble metal. The process continues until a desired amount of the non-noble metal in the preliminary structure is replaced by the noble metal.

11 Claims, 1 Drawing Sheet

METHOD FOR PRODUCING A NOBLE METAL-CONTAINING STRUCTURE ON A SUBSTRATE, AND SEMICONDUCTOR COMPONENT HAVING SUCH A NOBLE METAL-CONTAINING STRUCTURE

BACKGROUND OF THE INVENTION

Field of the Invention

The present invention relates to a method for producing a noble metal-containing structure on a substrate, for example a semiconductor wafer, and in particular for producing a very fine structure with a detail size on the micrometer scale or less. The invention further relates to a semiconductor component having a noble-metal containing structure of that type.

The semiconductor industry has for some time attached great importance to methods of the above-described type. One fundamental problem in the continuing miniaturization of integrated circuits is in the integration of capacitors. Since the capacitance of capacitors is proportional to their cross-sectional area, and therefore to the substrate area which they occupy, they cannot be miniaturized in the same way as transistors, for example.

One approach to solving that problem is in no longer using a reverse-biased PN junction or an insulating layer (silicon dioxide and/or silicon nitride) which is always present in MIS or MOS technology as the dielectric of the capacitor, but instead deliberately applying a dielectric layer of a material having a higher dielectric constant to the semiconductor substrate. Suitable materials for that purpose include, in particular, oxide ceramic materials such as, for example, lead zirconate titanate ($PbZr_{1-x}Ti_xO_3$, PZT), barium strontium titanate (($Ba,Sr)TiO_3$) or strontium bismuth tantalate ($SrBi_2Ta_2O_9$). If, for example, a material such as PZT, with a dielectric constant $\epsilon=1400$, is used instead of $Si_3N_4$, with a dielectric constant $\epsilon=7$, then it is possible, for equal capacitance, both to increase the layer thickness of the dielectric by a factor of 10, in order to improve its breakdown behavior, and to reduce the area of the capacitor by a factor of 20.

However, problems arise in the processing of oxide ceramic materials. Layers of those materials can be produced by sputtering, vapor deposition or sol-gel methods. Deposition has to be carried out in an oxygen-containing atmosphere, and a sol-gel layer has to be annealed in an oxygen atmosphere. Both have the effect of causing a polysilicon or silicide electrode material adjoining the dielectric to become oxidized, which impairs its conductivity and therefore the reliability of the entire circuit. In order to resolve that problem, it has been proposed to use platinum as the electrode material, since it is not attacked by oxygen during annealing or deposition of the dielectric layer.

One considerable disadvantage in the use of platinum as an electrode material is that those methods cannot yet be controlled sufficiently for microstructuring. A paper by Nishikawa et al. published in Jpn. J. Appl. Phys. 32 (1993) pages 6102–6108 describes methods for etching platinum layers with microwave plasmas and electroncyclotron resonance plasmas. The authors point out the particular difficulties which arise when processing platinum with sub-micrometer accuracy.

Attempts to etch platinum anisotropically by using energetic ions are described in a paper by A. Cofer, in VMIC Conference 1995, 638 and a paper by A. Cofer and B. Vail, in Tegal European Plasma Seminars proceedings 1995, 33. It is possible to etch platinum structures with an edge gradient of up to 68° by using that method. That result is still unsatisfactory in comparison with the values that can be achieved with materials such as Si and Al.

The problem with the etching method is that the platinum which is etched off does not form volatile compounds which are easy to remove from the reaction region, but to a large extent is re-deposited on the surface. Both effects limit the resolution which can be achieved when etching platinum.

SUMMARY OF THE INVENTION

It is accordingly an object of the invention to provide a method for producing a noble metal-containing structure, for example a platinum structure, on a substrate, and a semiconductor component having such a noble metal-containing structure, which overcome the hereinafore-mentioned disadvantages of the heretofore-known methods and devices of this general type and with which it is easy to achieve a resolution equaling that achieved with materials which are easier to process.

With the foregoing and other objects in view there is provided, in accordance with the invention, a method for producing a noble metal-containing structure on a substrate, which comprises a) producing, on a substrate, a preliminary structure formed of a non-noble metal and having a configuration of a desired structure; b) introducing the substrate into a given atmosphere containing a noble metal compound being gaseous at a temperature and under a pressure of the given atmosphere; and c) introducing noble metal into the preliminary structure by converting the compound of the noble metal with the non-noble metal into elementary noble metal and a gaseous compound of the non-noble metal, until a desired amount of the non-noble metal in the preliminary structure is replaced by the noble metal.

In the first step of the method according to the invention, a preliminary structure having a configuration which corresponds to that of the desired noble metal-containing structure is produced on the substrate by using a non-noble metal. Any well-mastered conventional methods can be used to produce the preliminary structure. The substrate with the preliminary structure is introduced into an atmosphere containing a gaseous compound of a noble metal which is intended to form the final structure or to be contained therein. A solid-state/gas-phase reaction takes place at the surface of the preliminary structure, during which the noble metal undergoes vapor deposition onto the preliminary structure and the non-noble metal in the preliminary structure forms a corresponding amount of a gaseous compound, because of the different bonding potentials of noble and non-noble metals. The noble metal which is deposited diffuses into the preliminary structure, while non-noble metal moves to the surface and reacts there. During this physical exchange, which basically takes place atom for atom, between the preliminary structure and the reaction gas atmosphere, the configuration of the preliminary structure is preserved exactly.

The exchange reaction may, in particular in the case of fine structures, be continued until essentially all of the non-noble metal atoms have diffused to the surface of the structure and reacted there, so that the non-noble metal is essentially fully replaced by the noble metal. However, in order to achieve the desired resistance to oxidation, it may be sufficient if only a predetermined alloy ratio between the noble metals and the non-noble metals is reached. In the case of coarser structures, it may be sufficient if merely a surface layer of predetermined thickness is replaced by the noble metal.

Through the use of the process temperature, it is possible to control the diffusion rate of the atoms in the preliminary structure and therefore the concentration gradient of the noble metal atoms into the preliminary structure, or the thickness of the noble metal layer.

Suitable noble metals include, for example, platinum, ruthenium and/or iridium, and the non-noble metal may be any other metal that can be structured by using microlithographic methods, for example aluminum, tungsten or titanium, or alternatively polysilicon. Metalorganic compounds, in particular acetylacetonates, can be used as the gaseous reaction partners in the exchange reaction.

With the objects of the invention in view, there is also provided a semiconductor component having at least one noble metal-containing structure produced by the method described above.

The semiconductor component according to the invention may have one or more noble metal structures produced by using the method according to the invention. If the semiconductor component has an oxide ceramic layer, for example of strontium bismuth tantalate, barium strontium titanate or lead zirconate titonate, which forms the dielectric of a capacitor, then a noble metal structure between the substrate and the oxide ceramic layer needs to be provided as one electrode of the capacitor, since conventional electrodes becomes oxidized when the oxide ceramic layer is produced.

Other features which are considered as characteristic for the invention are set forth in the appended claims.

Although the invention is illustrated and described herein as embodied in a method for producing a noble metal-containing structure on a substrate, and a semiconductor component having such a noble metal-containing structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
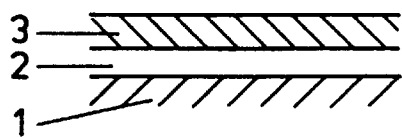
FIG. 1 is a fragmentary, highly diagrammatic, sectional view of a surface of a semiconductor wafer with a preliminary structure.
Figure 2:
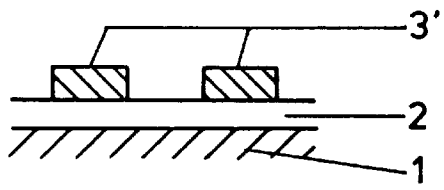
FIG. 2 is a fragmentary, sectional view showing the structure of FIG. 1 with a photoresist layer.

Referring now to the figures of the drawings in detail and first, particularly, to FIG. 1 thereof, there is seen a sectional view of a portion of a surface of a semiconductor wafer 1 with a preliminary structure 2, for example an evaporation-coated aluminum layer, and a photoresist layer 3. The photoresist layer 3 undergoes exposure. Exposed parts are dissolved by a developer, while unexposed parts 3' of the photoresist layer remain, as is seen in FIG. 2.

Figure 3:
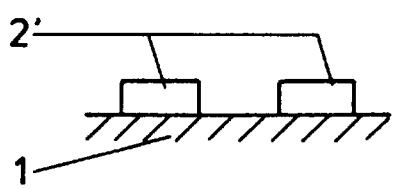
FIG. 3 is a fragmentary, sectional view showing the structure of FIG. 2 with a finished preliminary structure.

After that step, uncovered segments of the preliminary structure 2, that is to say the aluminum layer in this case, are etched down to the semiconductor wafer 1 and the remaining photoresist layer 3 is disposed of. A finished preliminary structure 2', which in this case is made of aluminum, remains on the semiconductor wafer 1, as is shown in FIG. 3.

Figure 4:
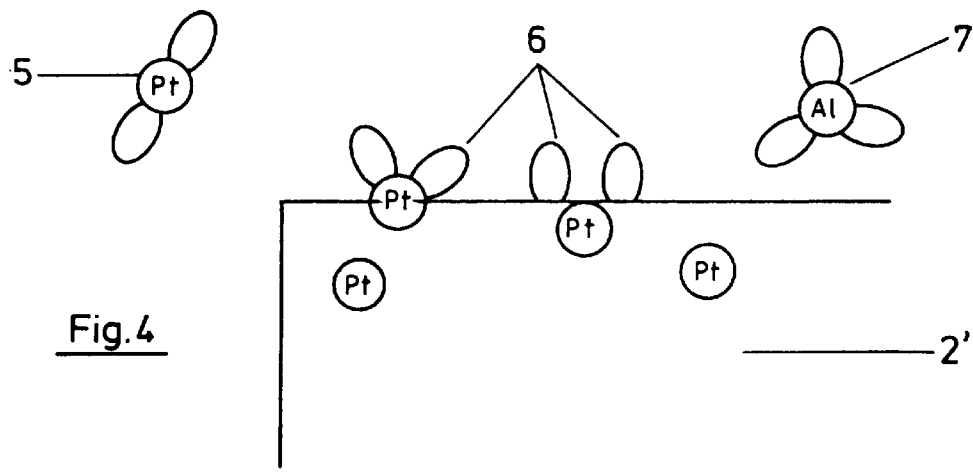
FIG. 4 is an enlarged, fragmentary, sectional view illustrating an exposure of the wafer and the preliminary structure to a certain temperature and atmosphere.

The semiconductor wafer 1, with the finished preliminary structure 2', is exposed at a temperature of about 350° C. to an atmosphere which contains platinum acetylacetonate. FIG. 4 shows the processes which take place during this step. Platinum acetylacetonate sublimes at 170° C. and decomposes at 420° C., and is thus stable at the chosen process temperature. Molecules of this gaseous compound 5 accumulate at the surface of the preliminary structure 2' and dissociate because the redox potential of aluminum is lower than that of platinum. This being the case, acetylacetonate groups 6 are transferred to the aluminum. This produces aluminum acetylacetonate 7. The boiling point of this compound is 315° C., and it is thus also gaseous at the chosen process temperature and leaves the surface.

In this way, over time, the surface of the preliminary structure 2' becomes ever more depleted of aluminum and richer in platinum. This results in a concentration gradient between the surface of the preliminary structure 2' and its core. Through diffusion, platinum penetrates the interior of the preliminary structure 2', while aluminum moves to the surface and is exchanged there.

In the case of a fine structure having layer thicknesses of a few tens of monometers, it is possible in this way for aluminum to be virtually fully exchanged in favor of platinum, or for an alloy ratio to be set up which corresponds to the numerous intermetallic phases of the aluminum/platinum system, but without the shape of the preliminary structure 2' being changed in the process.

The diffusion process is comparatively less efficient in the case of larger layer thicknesses, or relatively low process temperatures. With thick layers, it is not even necessary for aluminum to be fully exchanged, since a sufficiently deep exchange in the surface layer is enough to protect the remaining aluminum core from oxidation.

Figure 5:
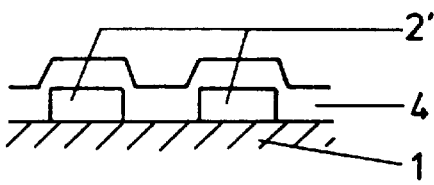
FIG. 5 is a fragmentary, sectional view showing the structure of FIG. 3 with an oxide ceramic layer.
Figure 6:
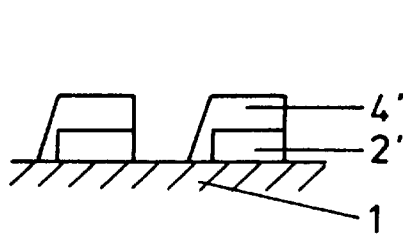
FIG. 6 is a fragmentary, sectional view showing the structure of FIG. 3 with dielectrics.

An oxide ceramic layer 4 can be deposited on the wafer which is prepared in this way, as is seen in FIG. 5, in order to produce dielectrics 4' of the capacitors shown in FIG. 6. This layer may, if necessary, be masked and etched in a known manner.

Figure 7:
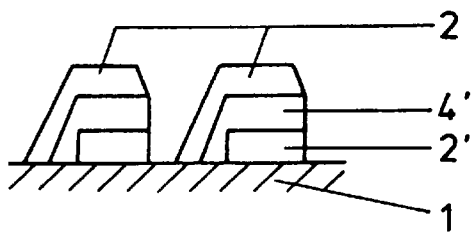
FIG. 7 is a fragmentary, sectional view showing the structure of FIG. 6 with another preliminary structure.

It is then possible to carry out a second cycle of the aluminization, masking and etching, in order to form a second preliminary structure 2 on the dielectrics 4', as is shown in FIG. 7. The method according to the invention is carried out once more on this preliminary structure in order to obtain finished integrated capacitors with platinum electrodes.

As an alternative, the second electrode may also be deposited surface-wide and structured by using the lift-off technique. This alternative is preferred, in particular, when a structure with a lower level of detail is required for the second electrode.

We claim:

1. A method for producing a noble metal-containing structure on a substrate, which comprises:

a) producing, on a substrate, a preliminary structure formed of a non-noble metal and having a configuration of a desired structure;
b) introducing the substrate into a given atmosphere containing a noble metal compound being gaseous at a temperature and under a pressure of the given atmosphere; and
c) introducing noble metal into the preliminary structure by converting the compound of the noble metal with the non-noble metal into elementary noble metal and a gaseous compound of the non-noble metal, until a desired amount of the non-noble metal in the preliminary structure is replaced by the noble metal.

2. The method according to claim 1, which comprises carrying out the step of producing the preliminary structure on a semiconductor wafer as the substrate.

3. The method according to claim 1, which comprises continuing step c) until the non-noble metal is substantially fully replaced by the noble metal.

4. The method according to claim 1, which comprises continuing step c) until a predetermined alloy ratio between the noble metal and the non-noble metal is reached.

5. The method according to claim 1, which comprises continuing step c) until the noble metal forms a layer of predetermined thickness on the structure.

6. The method according to claim 1, which comprises selecting the noble metal as at least one metal from the group consisting of Pt, Ru and Ir.

7. The method according to claim 1, which comprises selecting the non-noble metal as at least one metal from the group consisting of Al, W, Ti and poly-Si.

8. The method according to claim 1, which comprises selecting Pt as the noble metal and Al as the non-noble metal.

9. The method according to claim 1, which comprises selecting each of the gaseous compounds of the noble metal and of the non-noble metal as a metalorganic compound.

10. The method according to claim 9, which comprises selecting the compounds as acetylacetonates.

11. The method according to claim 10, which comprises selecting Pt as the noble metal and Al as the non-noble metal, and carrying out step c) at an atmosphere temperature of between 330 and 400° C.

* * * * *